United States Patent [19]

Bae et al.

[11] Patent Number: 5,781,494
[45] Date of Patent: Jul. 14, 1998

[54] VOLTAGE PUMPING CIRCUIT FOR SEMICONDUCTOR MEMORY DEVICE

[75] Inventors: Yong-Cheol Bae; Sei-Seung Yoon, both of Seoul; Dong-Il Seo, Suwon, all of Rep. of Korea

[73] Assignee: Samsung Electric, Co, Ltd., Suwon, Rep. of Korea

[21] Appl. No.: 782,896

[22] Filed: Dec. 27, 1996

[30] Foreign Application Priority Data

Dec. 27, 1995 [KR] Rep. of Korea ............... 95-59414

[51] Int. Cl.[6] ............................................. G11C 8/00
[52] U.S. Cl. ............................. 365/230.03; 365/226
[58] Field of Search ........................ 365/189.09, 226, 365/230.03

[56] References Cited

U.S. PATENT DOCUMENTS

5,521,869  5/1996  Ishimura et al. ............... 365/189.01
5,606,532  2/1997  Lambrache et al. ............ 365/238.5
5,617,357  4/1997  Haddad et al. ................ 365/185.27

*Primary Examiner*—David C. Nelms
*Assistant Examiner*—Michael T. Tran
*Attorney, Agent, or Firm*—Marger, Johnson, McCollom, & Stolowitz P.C.

[57] ABSTRACT

A semiconductor memory device comprising a memory cell array including at least two banks and a desired number of voltage pumping circuits each for pumping an input voltage to a desired level. The voltage pumping circuits are driven in response to at least two bank selection control signals. The voltage pumping circuits are arranged in the semiconductor memory device in a proper manner to efficiently perform the voltage pumping operation, so as to increase the pumping efficiency. Further, the proper arrangement of the voltage pumping circuits contributes to the integration of the semiconductor memory device.

7 Claims, 9 Drawing Sheets

VOLTAGE PUMPING CIRCUIT FOR SEMICONDUCTOR MEMORY DEVICE

BACKGROUND OF THE INVENTION

The present invention relates in general to a semiconductor memory device, and more particularly to a voltage pumping circuit for the semiconductor memory device which is operable adaptively to a bank operation.

Generally, a voltage pumping circuit is provided in a semiconductor memory device to generate a pumped voltage which is higher in level than an operating voltage in the memory device. For example, the pumped voltage from the voltage pumping circuit is representatively used as a word line voltage which is supplied to a word line and an isolation gate control signal which is transferred to isolation gates in a charge sharing sense amplifier configuration. The voltage pumping circuit typically comprises two parts, or a main pump and an active kicker. In the voltage pumping circuit, only the main pump is operated in a standby mode and both the main pump and active kicker are operated in an active mode to supply a large amount of charge. Recently, a semiconductor memory device comprises banks to perform a bank operation. The arrangement of voltage pumping circuits is important in such a semiconductor memory device performing the bank operation. In other words, because voltage pumping circuits include large-capacity capacitors, respectively, the number and position thereof have an important effect on a chip size. In a conventional memory device with no bank operation, sufficient voltage pumping circuits must be provided to supply pumped voltages to word lines being simultaneously enabled. Additional voltage pumping circuits must further be provided to supply pumped voltages to other elements.

Figure 1:
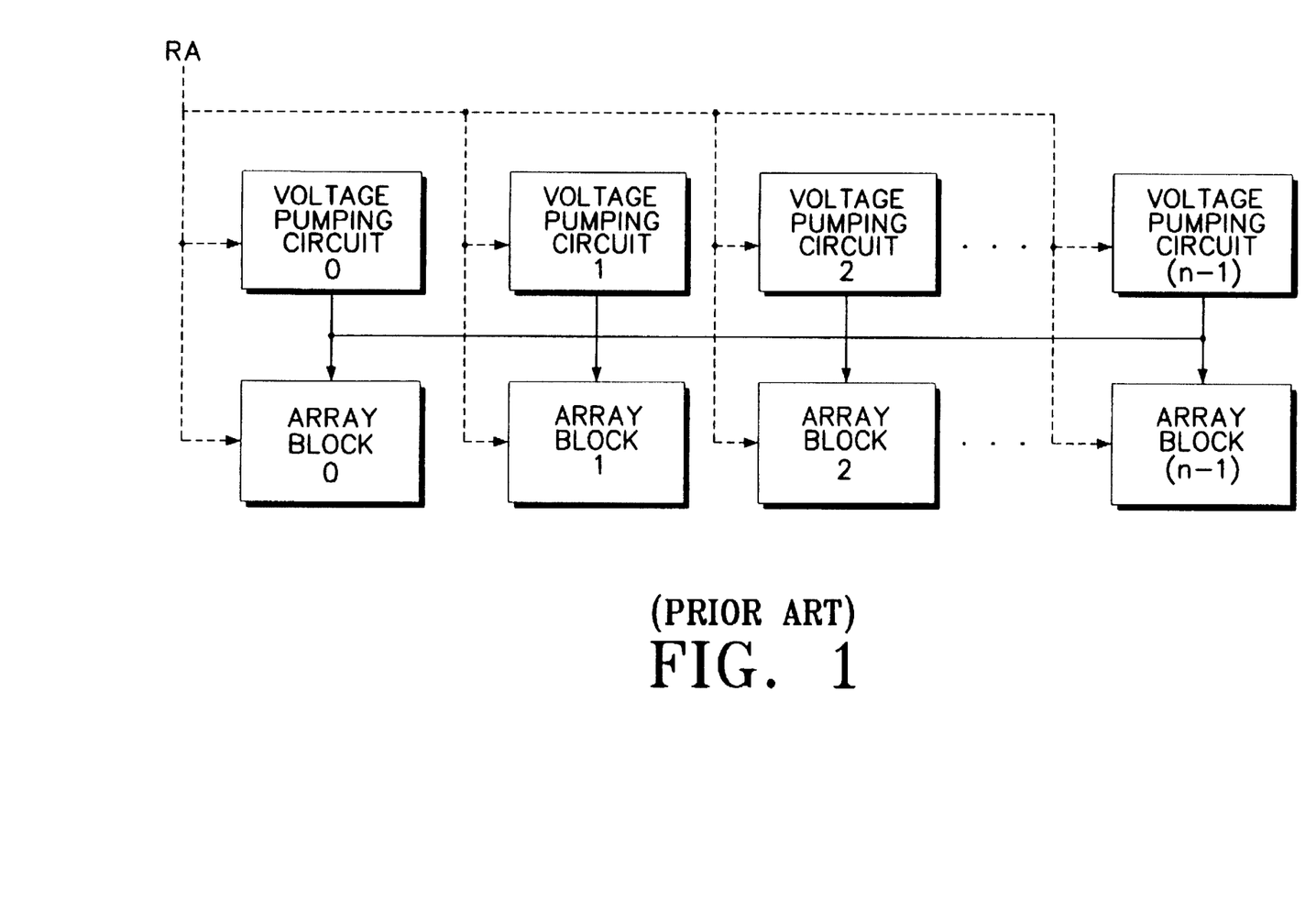
FIG. 1 is a block diagram illustrating a conventional layout of array blocks and voltage pumping circuits in a semiconductor memory device.

FIG. 1 is a block diagram illustrating a conventional layout of array blocks and voltage pumping circuits in a semiconductor memory device. As shown in this drawing, when a row address signal is applied, word lines in the array blocks corresponding to the applied row address signal are simultaneously enabled. At this time, the voltage pumping circuits are operated to supply word line voltages of pumped levels to the enabled word lines, respectively.

However, in a semiconductor memory device performing a bank operation, such as a synchronous memory, banks are provided in such a manner that a selected one thereof can be made active in response to bank selection information of the row address signal. As a result, a voltage pumping circuit is assigned to each of the banks to take charge of the corresponding bank. For this reason, voltage pumping circuits must be assigned to even the banks being made inactive, to supply pumped voltages to the corresponding banks. In this connection, the semiconductor memory device performing the bank operation is increased in chip size due to the arrangement of many voltage pumping circuits.

SUMMARY OF THE INVENTION

Therefore, the present invention has been made in view of the above problem, and it is an object of the present invention to provide a semiconductor memory device in which voltage pumping circuits are arranged in a proper manner to reduce a chip size.

In accordance with the present invention, the above and other objects can be accomplished by a provision of a semiconductor memory device comprising a memory cell array including at least two banks; and a desired number of voltage pumping circuits each for pumping an input voltage to a desired level; the voltage pumping circuits being driven in response to at least two bank selection control signals.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 2:
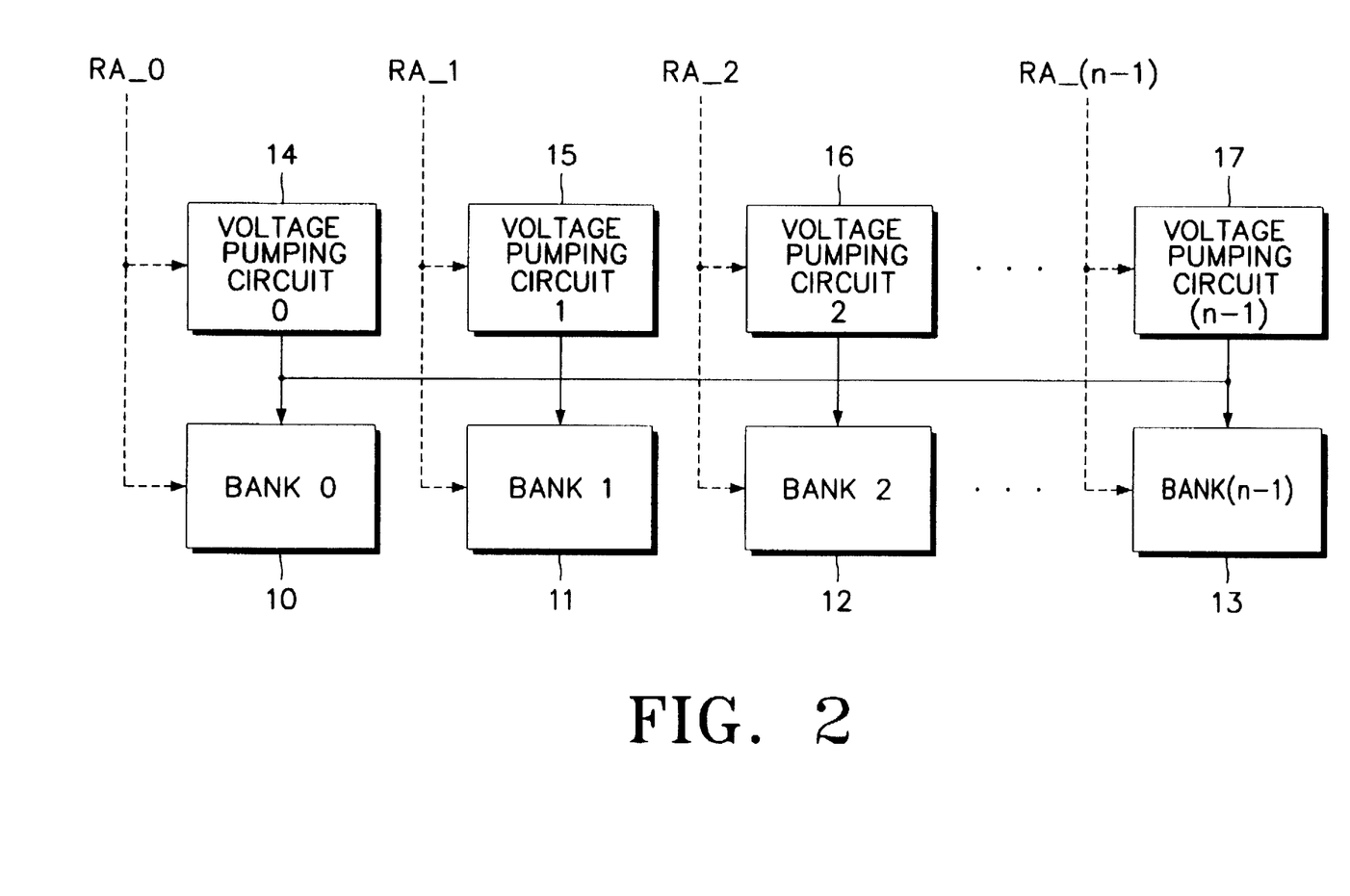
FIG. 2 is a block diagram illustrating a layout of banks and voltage pumping circuits in a semiconductor memory device in accordance with a first embodiment of the present invention.

FIG. 2 is a block diagram illustrating a layout of banks and voltage pumping circuits in a semiconductor memory device in accordance with a first embodiment of the present invention. As shown in this drawing, a memory cell array is divided into a plurality of banks or n banks 10–13 to which n voltage pumping circuits 14–17 are individually connected. The banks 10–13 and voltage pumping circuits 14–17 are enabled and driven in response to inherent bank selection information. So driven, each voltage pumping circuit performs a voltage pumping operation to transfer a boosted word line voltage to a selected word line of the enabled bank.

In FIG. 2, when a desired one of the banks 10–13 is selected, the one of the voltage pumping circuits 14–17 connected thereto performs the voltage pumping operation. Noticeably, in each short row address strobe cycle (referred to hereinafter as "tRRD cycle") where the same bank is made active at a time point that a row address strobe signal is made active two times, the voltage pumping operation of the voltage pumping circuit might not be secured with a precharge operation. For this reason, the arrangement of FIG. 2 is applicable only in the case where a row address strobe cycle is long.

Figure 3:
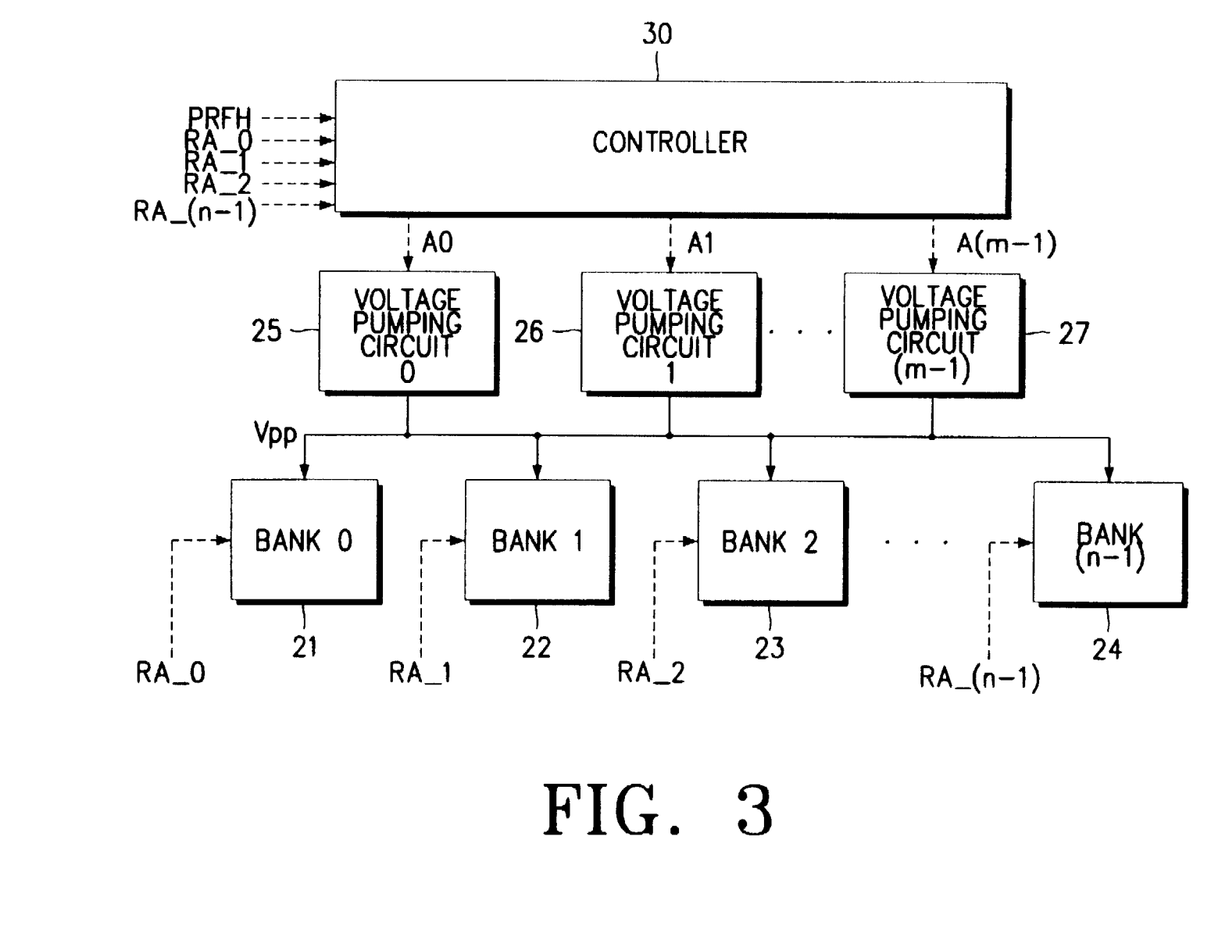
FIG. 3 is a block diagram illustrating a layout of banks, voltage pumping circuits and a control circuit in a semiconductor memory device in accordance with a second embodiment of the present invention.

FIG. 3 is a block diagram illustrating a layout of banks, voltage pumping circuits and a control circuit in a semiconductor memory device in accordance with a second embodiment of the present invention. As shown in this drawing, a memory cell array is divided into a plurality of banks or n banks 21–24, in a similar manner to FIG. 2. A desired number of voltage pumping circuits or m voltage pumping circuits 25–27 are connected to the banks 21–24. A control circuit 30 has its input terminals for inputting a row address control signal PRFH and row address signals RA_0-RA_(n-1), respectively, and its output terminals connected respectively to input terminals of the voltage pumping circuits 25-27.

In FIG. 3, m voltage pumping circuits are sequentially driven in a bank active mode so that the voltage Pumping operation can be secured in each tRRD cycle. For example, in the case where the tRRD cycle is 20 ns and the voltage pumping operation cycle is 40 ns the voltage pumping operation can reasonably be performed in the bank active mode by alternately driving two voltage pumping circuits. Provided that the tRRD cycle is short or the voltage pumping operation cycle is long, m voltage pumping circuits are required, where m is a minimum integer larger than a value which is obtained by dividing the voltage pumping operation cycle by the tRRD cycle. At this time, the m voltage pumping circuits are sequentially operated. Therefore, in a semiconductor memory device with many banks, the pumped voltage necessary to the bank operation can be supplied by employing at least m voltage pumping circuits. As a result, the voltage pumping operation can efficiently be performed and the chip size can be reduced.

Figure 4:
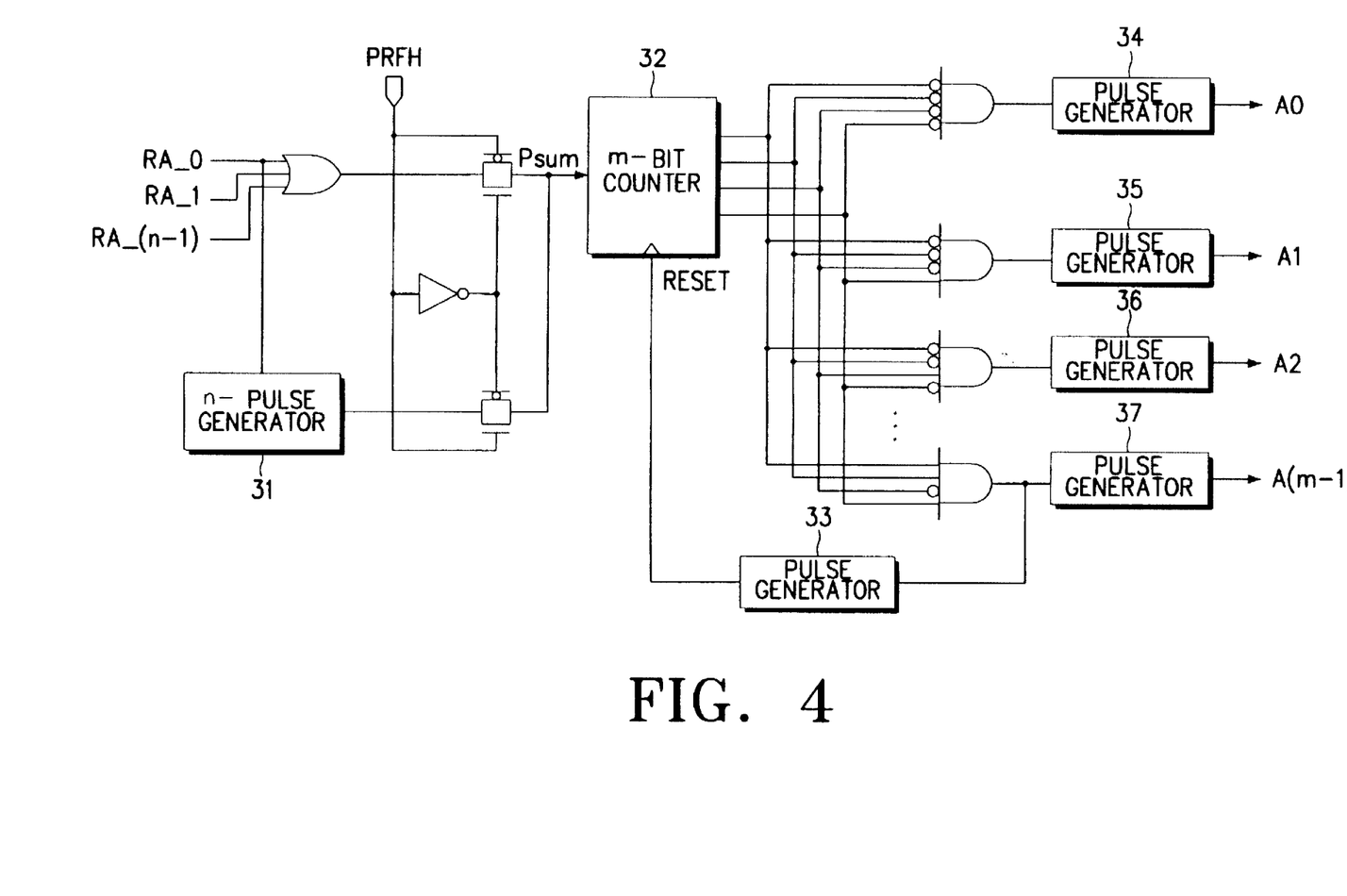
FIG. 4 is a detailed circuit diagram illustrating an embodiment of the control circuit in FIG. 3.
Figure 5:
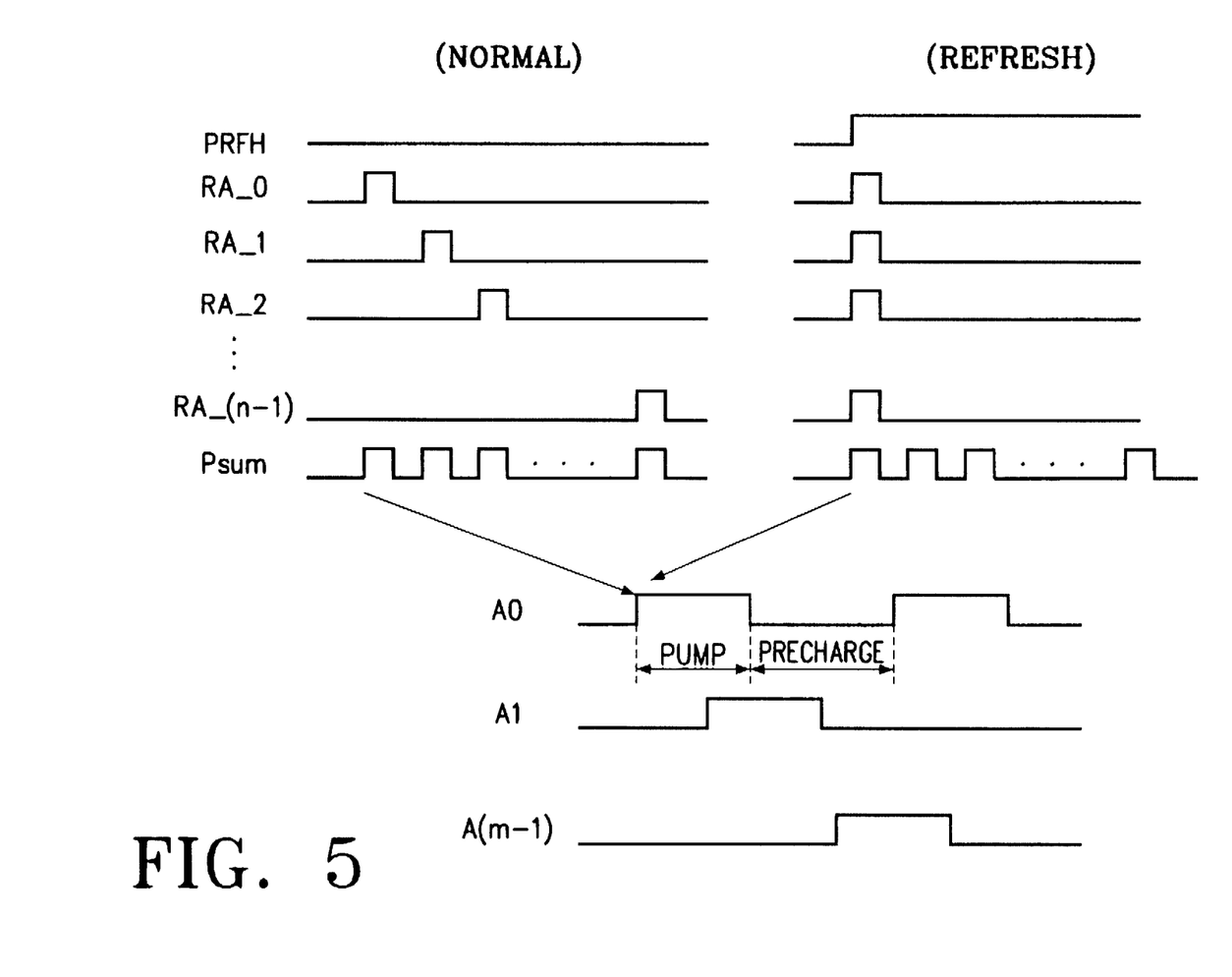
FIG. 5 is a timing diagram illustrating the operation of the control circuit in FIG. 4.

FIG. 4 is a detailed circuit diagram illustrating an embodiment of the control circuit 30 in FIG. 3 and FIG. 5 is a timing diagram illustrating the operation of the control circuit 30 in FIG. 4.

In FIG. 4, the control circuit 30 is constructed to control at least two voltage pumping circuits. The control circuit 30 includes an n-pulse generation circuit 31 for allowing the pumping operation to be performed n times in a refresh mode similarly to the normal mode (see FIG. 5). The output of the n-pulse generation circuit 31 is transferred to an m-bit counter 32 through a transfer gate which is switched in response to the row address control signal PRFH.

Figure 6:
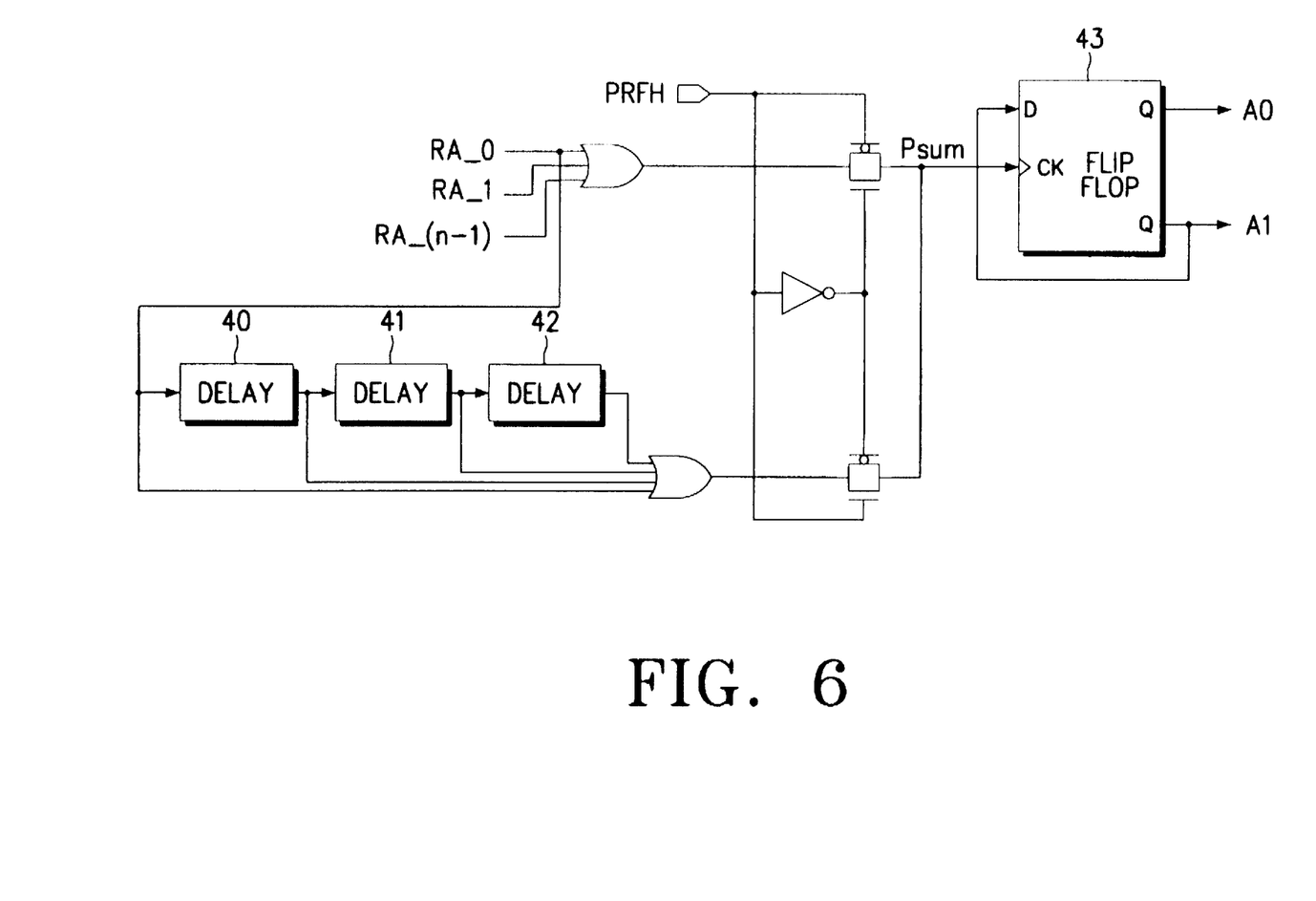
FIG. 6 is a detailed circuit diagram illustrating an alternative embodiment of the control circuit in FIG. 3.
Figure 7:
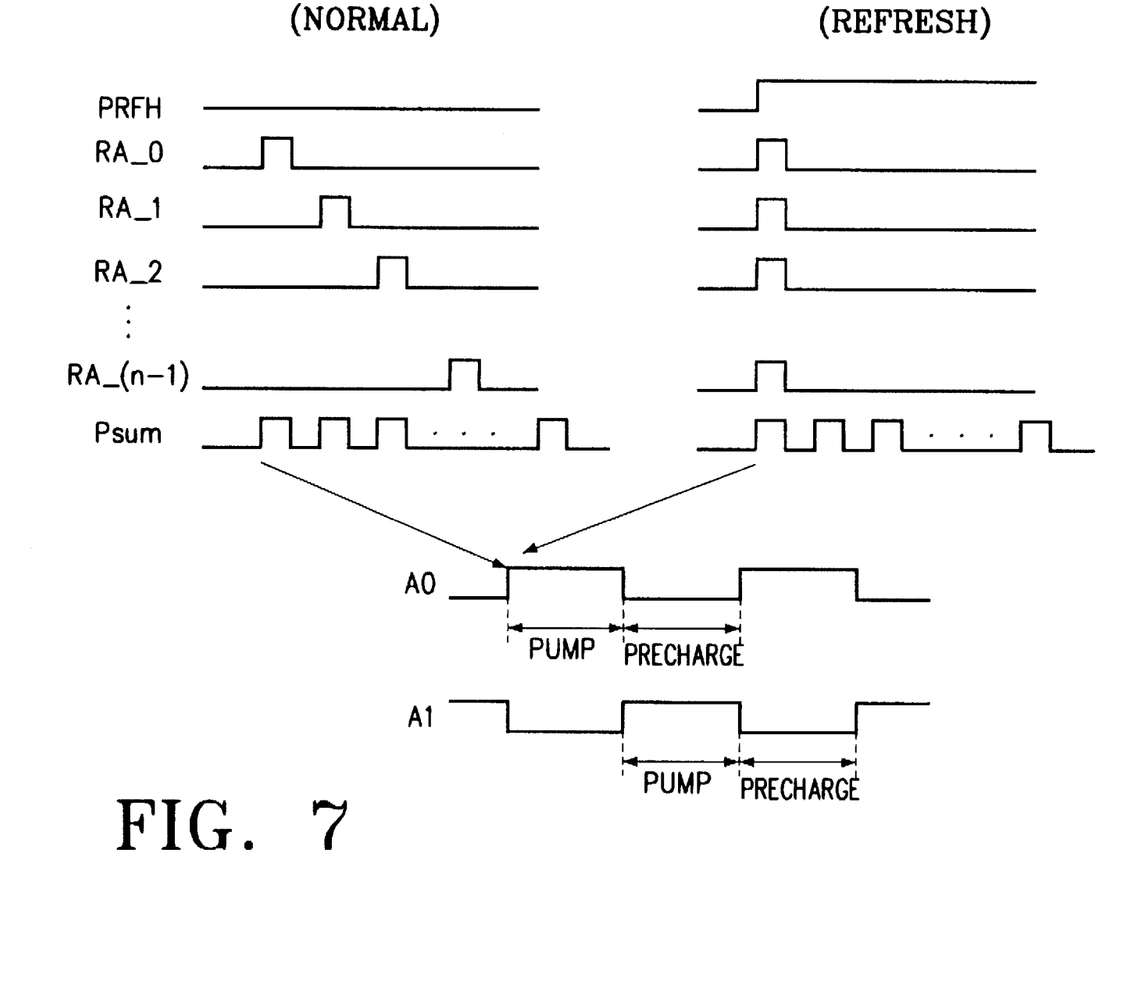
FIG. 7 is a timing diagram illustrating the operation of the control circuit in FIG. 6.

FIG. 6 is a detailed circuit diagram illustrating an alternative embodiment of the control circuit 30 in FIG. 3 and FIG. 7 is a timing diagram illustrating the operation of the control circuit 30 in FIG. 6.

In FIG. 6, the control circuit 30 is constructed to control two voltage pumping circuits (i.e., m=2). A D flip-flop 43 is provided to generate a signal which is triggered synchronously with a positive edge of an input signal. The two voltage pumping circuits are alternately operated ill response to the output signal from the D flip-flop 43. In other words, the voltage pumping circuit 1 is precharged when the voltage pumping circuit 0 performs the voltage pumping operation. Also, the voltage pumping circuit 1 performs the voltage pumping operation when the voltage pumping circuit 0 is precharged. An n-pulse generation circuit is required to allow the pumping operation to be performed n times in the refresh mode similarly to the normal mode. The output of the n-pulse generation circuit (RA_O through RA_(n-1) in FIG. 7) is transferred to the D flip-flop 43 through a transfer gate which is switched in response to the row address control signal PRFH. In FIG. 6, the n-pulse generation circuit includes three delay elements 40-42 and one OR gate arranged to provide the Normal RA output signals in FIG. 7.

Figure 8:
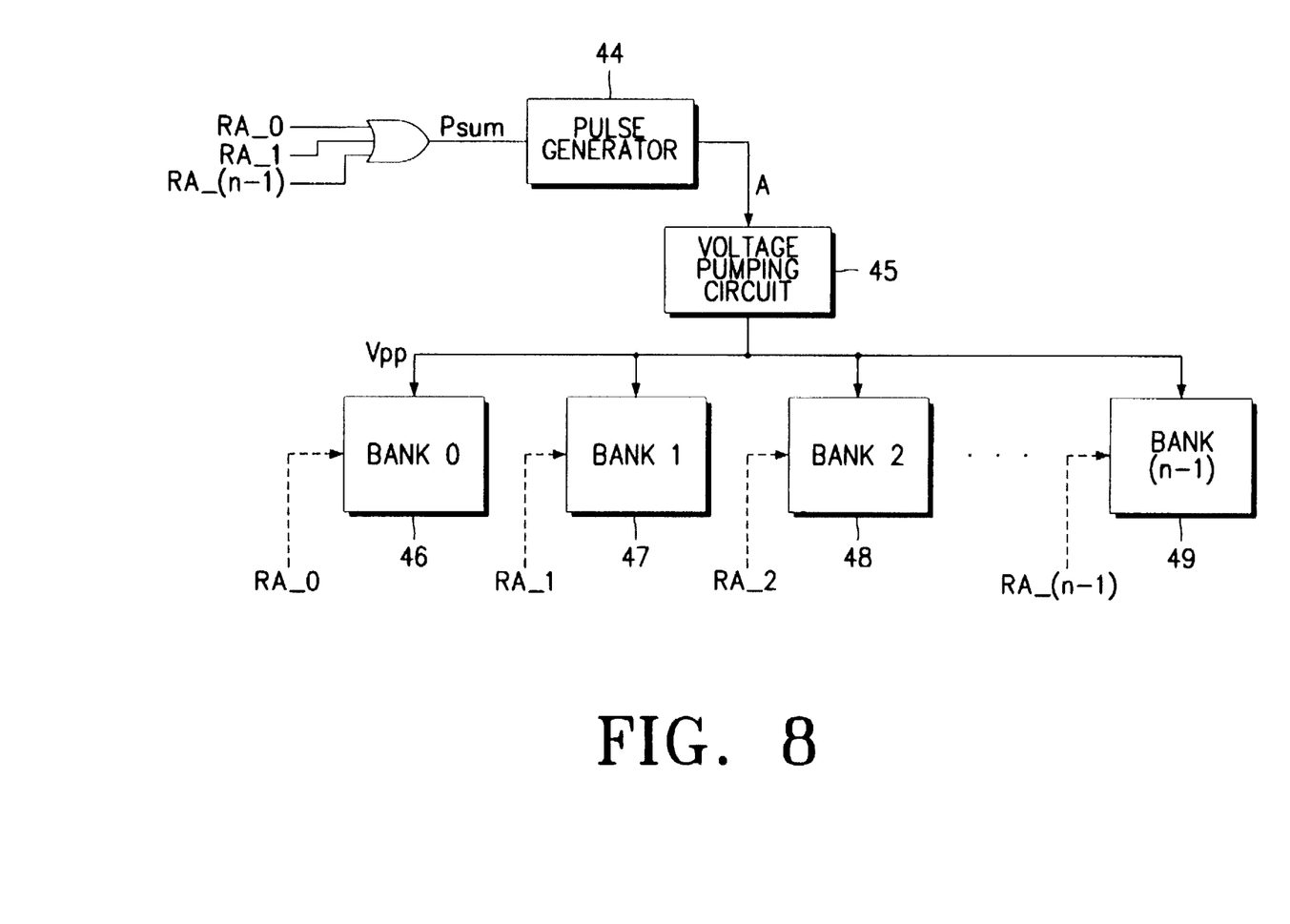
FIG. 8 is a block diagram illustrating a layout of banks, a voltage pumping circuit and a control circuit in a semiconductor memory device in accordance with a third embodiment of the present invention.
Figure 9:
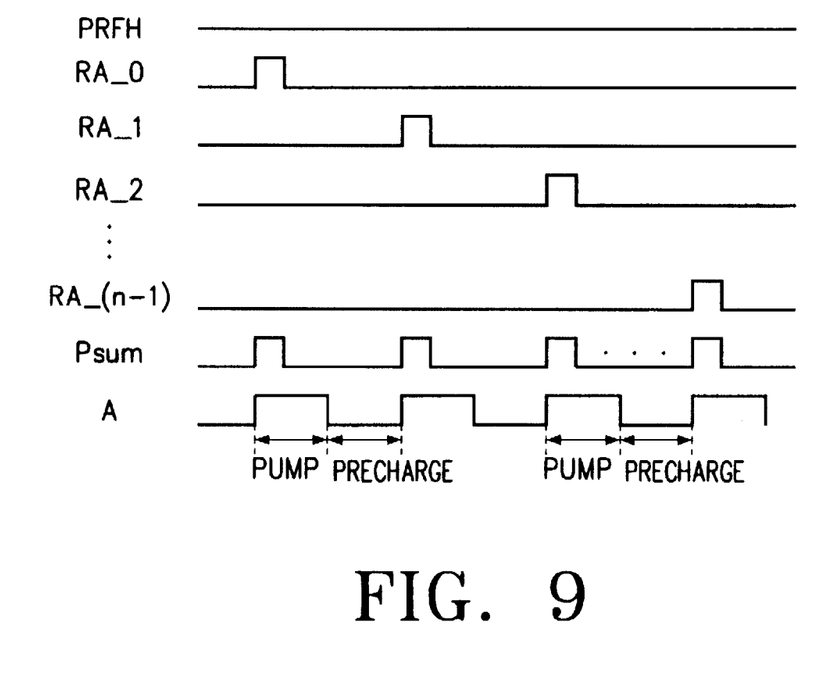
FIG. 9 is a timing diagram illustrating the operation of the control circuit in FIG. 8.

FIG. 8 is a block diagram illustrating a layout of banks 46-49, a voltage pumping circuit 45 and a control circuit 44 in a semiconductor memory device in accordance with a third embodiment of the present invention. FIG. 9 is a timing diagram illustrating the operation of the control circuit in FIG. 8.

In FIG. 8, bank active signals are inputted at a period of the tRRD cycle and then combined into a signal in the form of pulse train, which controls the voltage pumping circuit. In the case where the voltage pumping operation an the precharge operation are secured in each tRRD cycle, a single voltage pumping circuit 45 can assure the pumped voltage level in a semiconductor memory device employing many banks. However, as mentioned above, in the case where the tRRD cycle is short, In voltage pumping circuits must be sequentially driven to assure the pumped voltage level in such a semiconductor memory device.

As apparent from the above description, according to the present invention, the voltage pumping circuits arc arranged in the semiconductor memory device in a proper manner to efficiently perform the voltage pumping operation, so as to increase the pumping efficiency. Further, the proper arrangement of the voltage pumping circuits contributes to the integration of the semiconductor memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device comprising:
   a memory cell array including at least two banks;
   a desired number of voltage pumping circuits each for pumping an input voltage to a desired level;
   said voltage pumping circuits being driven in response to at least two bank selection control signals received from a control circuit, the control circuit including:
   a multi-pulse generation circuit for generating a sequential pulse signal if at least one of said banks is selected; and
   a counter for generating a count signal in response to an output signal from said multi-pulse generation circuit.

2. A semiconductor memory device comprising:
   a memory cell array including at least two banks;
   a predetermined number of voltage pumping circuits each for pumping an input voltage to a desired level; and
   a control circuit for generating a control signal in a fixed order;
   said voltage pumping circuits being driven in response to an output signal from said control circuit if at least one of said banks is selected;
   said control circuit including:
   a multi-pulse generation circuit for generating a sequential pulse signal if at least one of said banks is selected; and
   a counter for generating a count signal in response to an output signal from said multi-pulse generation circuit.

3. A semiconductor memory device as set forth in claim 2, wherein said voltage pumping circuits arc two in number.

4. A semiconductor memory device comprising:
   a memory cell array including at least two banks;
   a voltage pumping circuit for pumping an input voltage to a desired level;
   said voltage pumping circuit being driven if at least one of said banks is selected under control of a control circuit which includes:
   a multi-pulse generation circuit for generating a sequential pulse signal if at least one of said banks is selected; and
   a counter for generating a count signal in response to an output signal from said multi-pulse generation circuit.

5. A method of voltage pumping in a semiconductor memory device which includes at least one memory array, the method comprising:

dividing the memory array into a first plurality of banks, each bank being uniquely addressible by a respective row address signal;

coupling a second plurality of voltage pumping circuits to the banks of the memory array;

enabling a selected one of the banks of the memory array by addressing the selected bank by its respective row address signal;

actuating at least one of the voltage pumping circuits under control of a logical function which includes the row address signal, to transfer a boosted word line voltage to a selected word line of the enabled bank; the actuating step including:

generating a sequential pulse signal for the one of said banks which is selected; and generating a count signal in response to an output signal from said multi-pulse generation circuit.

6. A method according to claim 5, in which the memory device is arranged so that each bank has a corresponding dedicated voltage pump circuit which is activated by the row address signal for that bank.

7. A method according to claim 5, in which the voltage pumping circuits are coupled to more than one of the banks, and the banks have more than one voltage pumping circuit coupled to them, the voltage pumping circuit being controlled by a logical function of the row address signals for all of the banks.

* * * * *

UNITED STATES PATENT AND TRADEMARK OFFICE
CERTIFICATE OF CORRECTION

PATENT NO.    : 5,781,494
DATED         : July 14, 1998
INVENTOR(S)   : Bae et al.

It is certified that error appears in the above-identified patent and that said Letters Patent is hereby corrected as shown below:

Column 1,
Lines 56-57, "Therefore, the present invention has been made in view of the above problem, and it is" should read -- Therefore, in view of the above problem, it is --.
Line 59, "arc" should read -- are --.

Column 2,
Line 4, "derailed" should read -- detailed --.

Column 3,
Line 44, "ill" should read -- in --.

Column 4,
Line 2, "an" should read -- and --.
Line 7, "is short. In voltage" should read -- is short, voltage --.
Lines 11 and 54, "arc" should read -- are --.

Signed and Sealed this

Tenth Day of September, 2002

Attest:

Attesting Officer

JAMES E. ROGAN
Director of the United States Patent and Trademark Office